US012484176B2

(12) United States Patent
O'Donnell et al.

(10) Patent No.: US 12,484,176 B2
(45) Date of Patent: Nov. 25, 2025

(54) ADJUSTABLE MEMBERS FOR SECURITY BEZELS

(71) Applicant: Dell Products L.P., Round Rock, TX (US)

(72) Inventors: Sean P. O'Donnell, Poughkeepsie, NY (US); Yi-Hsin Kuan, Taipei (TW); Matthew Bryan Gilbert, Bend, OR (US); Nicholas Lenn Poteracki, Austin, TX (US); Kevin Michael Keller, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 166 days.

(21) Appl. No.: 18/496,213

(22) Filed: Oct. 27, 2023

(65) Prior Publication Data

US 2025/0142756 A1 May 1, 2025

(51) Int. Cl.
*H05K 7/14* (2006.01)

(52) U.S. Cl.
CPC ......... *H05K 7/1402* (2013.01); *H05K 7/1495* (2013.01)

(58) Field of Classification Search
CPC .. H05K 7/1402; H05K 7/1495; H05K 7/1487; H05K 7/1401; H05K 7/1488; H05K 7/1485; H05K 7/20; H05K 7/20009; H05K 7/20127; H05K 7/20709; H05K 7/20536
See application file for complete search history.

(56) References Cited

U.S. PATENT DOCUMENTS

| | | | |
|---|---|---|---|
| 7,002,799 B2 | 2/2006 | Malone et al. | |
| 8,941,993 B2 | 1/2015 | Eckberg et al. | |
| 10,251,299 B1* | 4/2019 | Wang | E05C 9/026 |
| 10,324,503 B1* | 6/2019 | O'Donnell | H05K 9/0062 |
| 11,334,125 B1 | 5/2022 | Crisp | |
| 11,723,167 B2 | 8/2023 | Chen | |
| 2013/0220562 A1* | 8/2013 | Jenkins | H05K 7/1495 160/368.1 |
| 2020/0030734 A1 | 1/2020 | Hara | |
| 2020/0333856 A1 | 10/2020 | Quijano | |
| 2023/0128507 A1 | 4/2023 | Clark | |
| 2023/0129135 A1 | 4/2023 | Clark | |

* cited by examiner

*Primary Examiner* — Dimary S Lopez Cruz
(74) *Attorney, Agent, or Firm* — WOMBLE BOND DICKINSON (US) LLP

(57) ABSTRACT

Methods, systems, and devices for providing computer implemented services are disclosed. To provide the computer implemented services, a data processing system may include various hardware components. To secure the various hardware components, the data processing system may include a security bezel. The security bezel may for a chassis of the data processing system, the hardware components being positioned on an interior of the chassis. The security bezel may have a structural body that has a length that is equal to or less than a length of a two-dimensional surface through which access to the interior is provided. The security bezel may further have an adjustable member adapted to adjust a length of the structural bezel to match the length of the surface while reversibly securing the structural body to the chassis.

20 Claims, 10 Drawing Sheets

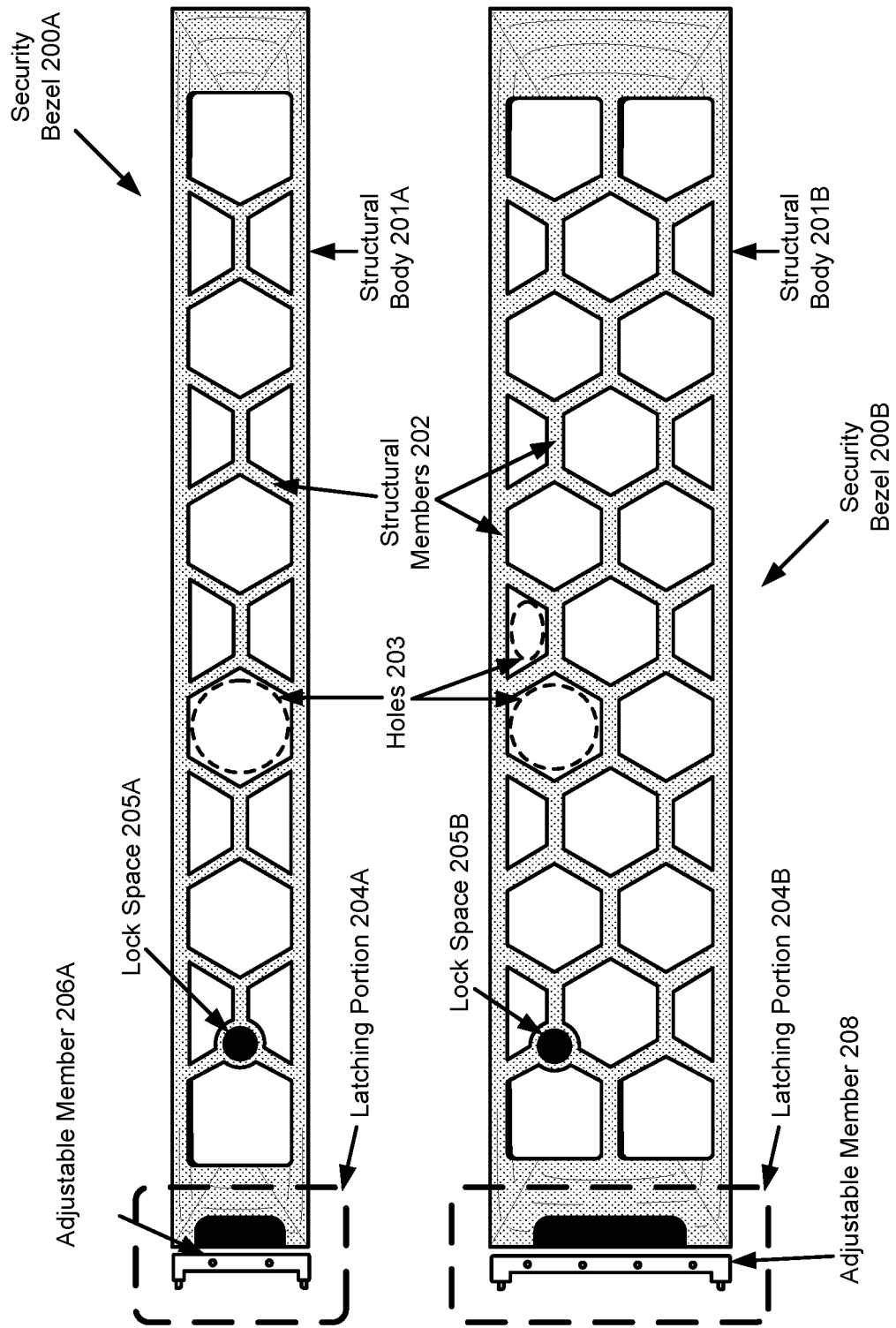

ADJUSTABLE MEMBERS FOR SECURITY BEZELS

FIELD

Embodiments disclosed herein relate generally to device management. More particularly, embodiments disclosed herein relate to managing security of devices.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

FIG. 2A shows diagrams illustrating a security bezel in accordance with an embodiment.

DETAILED DESCRIPTION

Figure 1A:
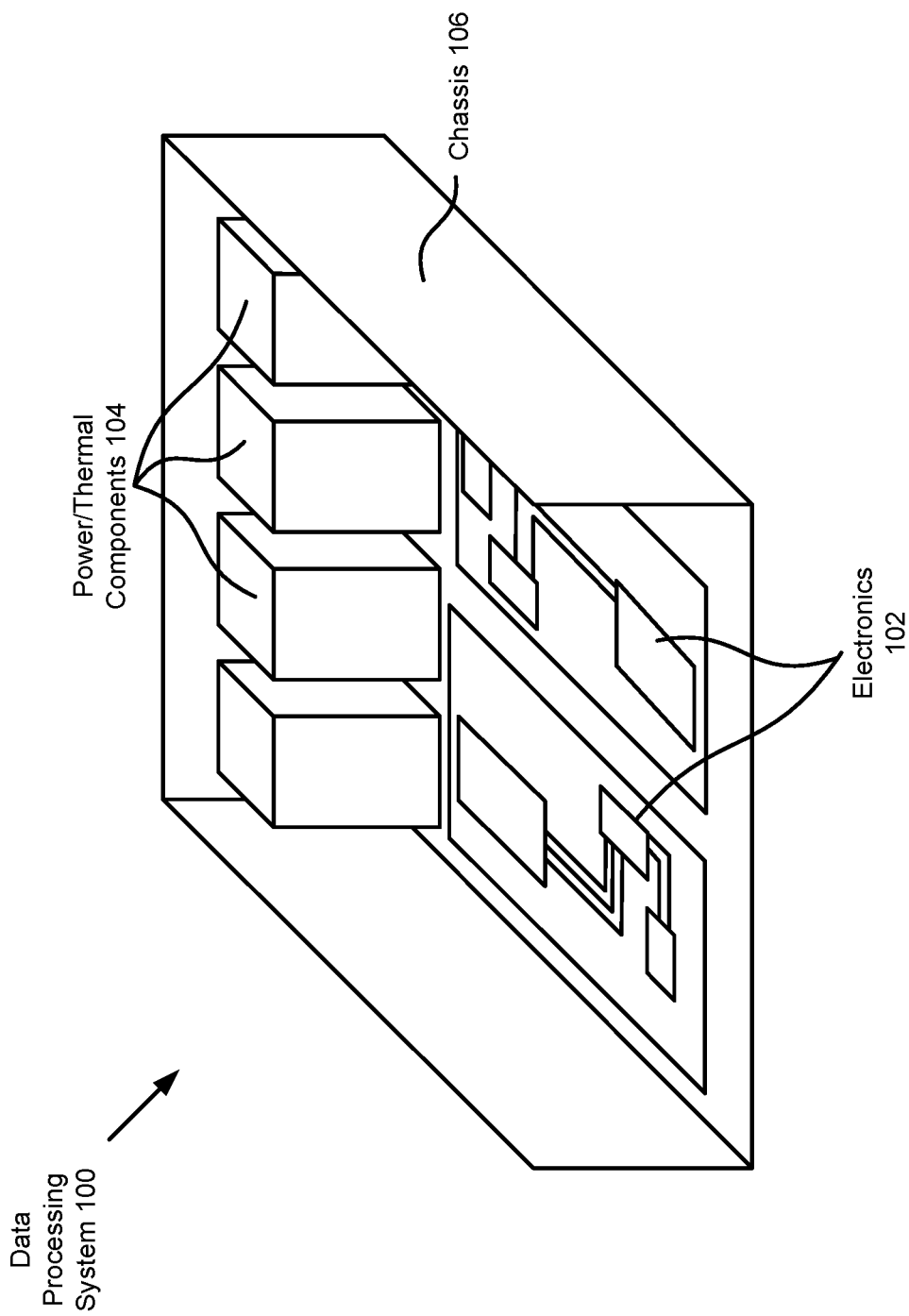
FIGS. 1A-1B show block diagrams illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing, at least in part, computer implemented services. To provide the services, a system may include any number of hardware components (e.g., storage devices, memory modules, processors, etc.). To facilitate placement and management of the hardware components, the hardware components may be positioned in a chassis.

For example, the chassis may be a form factor compliant (e.g., a ½U sled) enclosure. The enclosure, to provide its functionality, may include an opening through which access to the hardware components is provided. For example, this access may facilitate insertion and/or removal of hot swap components and may facilitate airflow into and/or out of the enclosure.

Consequently, access to the hardware components provided by the opening may leave the hardware components vulnerable to compromise (e.g., due to theft and/or damage of the hardware components). If damaged, the hardware components may be prevented from providing various functionalities (on which the computer implemented services depend) as intended. Additionally, for example, the hardware components may be stolen using the access. Once removed, the stolen hardware components would not be capable of providing the various functionalities on which the computer implemented services depend. Thus, the vulnerability provided by the access may increase a likelihood of compromise of the computer implemented services.

To decrease the likelihood of compromise of the hardware components, the data processing system may include a security bezel to limit access to the hardware components. To do so, the security bezel may prevent intrusion into an interior of the enclosure through the opening and resist deformation due to force applied to the security bezel.

However, the security bezel may be implemented with a structural body that has a length that is equal to or less than a length of the opening. Therefore, if less than the length of the opening, for example, the length of the structural body may prevent the security bezel from properly preventing the intrusion into the interior (e.g., the security bezel being unable to be secured to the chassis and/or otherwise adequately cover the opening to prevent the intrusion).

To adjust the length of the security bezel, the security bezel may include an adjustable member that connects to at least one side of the structural body. By connecting the adjustable member to the structural body, the length of the security bezel may match the length of the opening. Thus, the security bezel may be properly secured to the chassis and adequately cover the opening to prevent the intrusion, thereby limiting access to the hardware components within the interior of the enclosure and decreasing a likelihood of compromise of the hardware components on which the computer implemented services depend.

In an embodiment, a security bezel for a chassis of a data processing system is provided.

The security bezel may include a structural body that has a first length that is equal to or less than a second length of a two-dimensional surface on the chassis, prevents intrusion into an interior of the chassis through the surface, facilitates traversal of gases through the surface, and resists deformation due to force applied to the security bezel; and an adjustable member adapted to adjust a third length of the security bezel to match the second length, and reversibly secure the structural body to the chassis.

The adjustable member may be one selected from a group of adjustable members consisting of an adjustable member kit that may include at least two interchangeable members; and a continuously adjustable member.

The security bezel may have a fourth length when the structural body is connected to a first interchangeable member of the at least two interchangeable members, and a fifth length when the structural body is connected to a second interchangeable member of the at least two interchangeable members.

The fourth length may match the second length, and the fifth length may match a sixth length of a second surface on a second chassis, the second length and the sixth length being different lengths.

The continuously adjustable member may include an interference surface adapted to receive a placement element, the continuously adjustable member being held in place with respect to the structural body while the placement element is received by the interference surface; and a sliding surface adapted to slide along the structural body while the placement element is not received by the interference surface to allow for continuous adjustment of the third length over a range.

The structural body may include structural members that form a partial covering for the surface, the structural members may include a structural member adapted to span a distance between two points on the surface, and resist deformation due to force applied to the structural member.

The structural body may further include holes through the structural body, the holes may include a hole that may be positioned over a portion of the surface while the security bezel is attached to the chassis, the portion being at least partially bounded by the structural member, may be adapted to allow traversal of gasses through the at least partially bounded portion, and may have a size adapted to prevent intrusion into an interior of the chassis through the at least partially bound portion.

The size may be further adapted to facilitate movement of objects below a size threshold through the portion.

The hole may further include a portion of a lock space in which a lock mechanism of the security bezel is positioned, the lock mechanism being adapted to reversibly lock the security bezel to the chassis.

The security bezel may further include a second adjustable member, the adjustable member and the second adjustable member being adapted for reversible attachment to opposite sides of the structural body.

In an embodiment, a data processing system is provided that may include the security bezel as discussed above.

In an embodiment, an enclosure that may include the security bezel as discussed above is provided.

Turning to FIG. 1A, a diagram illustrating a data processing system in accordance with an embodiment is shown. The data processing system shown in FIG. 1A may provide computer implemented services. The computer implemented services may include any type and/or quantity of computer implemented services. For example, the computer implemented services may include data storage services, instant messaging services, database services, and/or any other type of service that may be implemented with a computing device.

To provide the computer implemented services, the data processing system may include various hardware components. These hardware components may facilitate various functionalities of a data processing system (e.g., 100). For example, to provide the computer implemented services, data processing system 100 may include electronics 102, power/thermal components 104, and chassis 106. Each of these is discussed below.

Electronics 102 may include various types of hardware components such as processors, memory modules, storage devices, communications devices, and/or other types of devices. Any of these hardware components may be operably connected to one another using circuit card traces, cabling, connectors, etc. that establish electrical connections used to transmit information between the hardware components.

Power/thermal components 104 may power any of the components of data processing system 100 and/or thermally manage any of the components of data processing system 100. For example, power/thermal components 104 may include power supplies, fans, and/or other types of devices usable to power and/or thermally manage the components.

Any of the components of data processing system 100 may be positioned in chassis 106. Chassis 106 may include an enclosure in which physical structures of electronics 102 (e.g., processors, memory, etc.) and power/thermal components 104 (e.g., power supplies, fans, etc.) may be positioned. Chassis 106 may facilitate placement and management of electronics 102 and/or other components in a computing environment.

To provide its functionality, chassis 106 may be implemented with a form factor compliant (e.g., a ½U sled) enclosure usable to integrate data processing system 100 into a high-density computing environment, such as a rack mount chassis management system.

To facilitate the placement and management of the components within chassis 106, chassis 106 may include an opening (e.g., on a front side and/or a back side of chassis 106) through which access to the hardware components of data processing system 100 is provided. For example, this access may facilitate insertion and/or removal of hot swap components for chassis 106. Additionally, the opening may facilitate airflow into and/or out of chassis 106, thereby providing additional thermal management (e.g., cooling) for data processing system 100.

However, the access to the hardware components provided by the opening in the enclosure may leave data processing system 100 vulnerable to compromise (e.g., due to theft and/or damage of the hardware components). For example, a negligent and/or an incompetent individual may interact with the hardware components using the access, resulting in bent contact pins, ruptured liquid cooling tubes, and/or other physical damages caused by the individual. If damaged, the hardware components may be prevented from providing various functionalities (on which the computer implemented services depend) as intended.

Additionally, for example, the hardware components may be stolen from chassis 106 using the access. Once removed, the stolen hardware components may not be available to data processing system 100, and therefore, would not be capable of providing the various functionalities on which the computer implemented services depend.

Thus, the vulnerability provided by the access may increase a likelihood of compromise of the computer implemented services.

In general, embodiments disclosed herein relate to systems, methods, and devices for managing security of a data processing system. More particularly, embodiments disclosed herein may relate to security management of hardware components of a data processing system. The security of the hardware components may be managed to decrease a likelihood of compromise caused by access to the hardware components. To do so, the data processing system (e.g., 100) may include a security bezel as seen in FIG. 1B (discussed below).

While illustrated in FIG. 1A with a limited number of specific components, a data processing system may include additional, fewer, and/or different components without departing from embodiments disclosed herein.

Figure 1B:
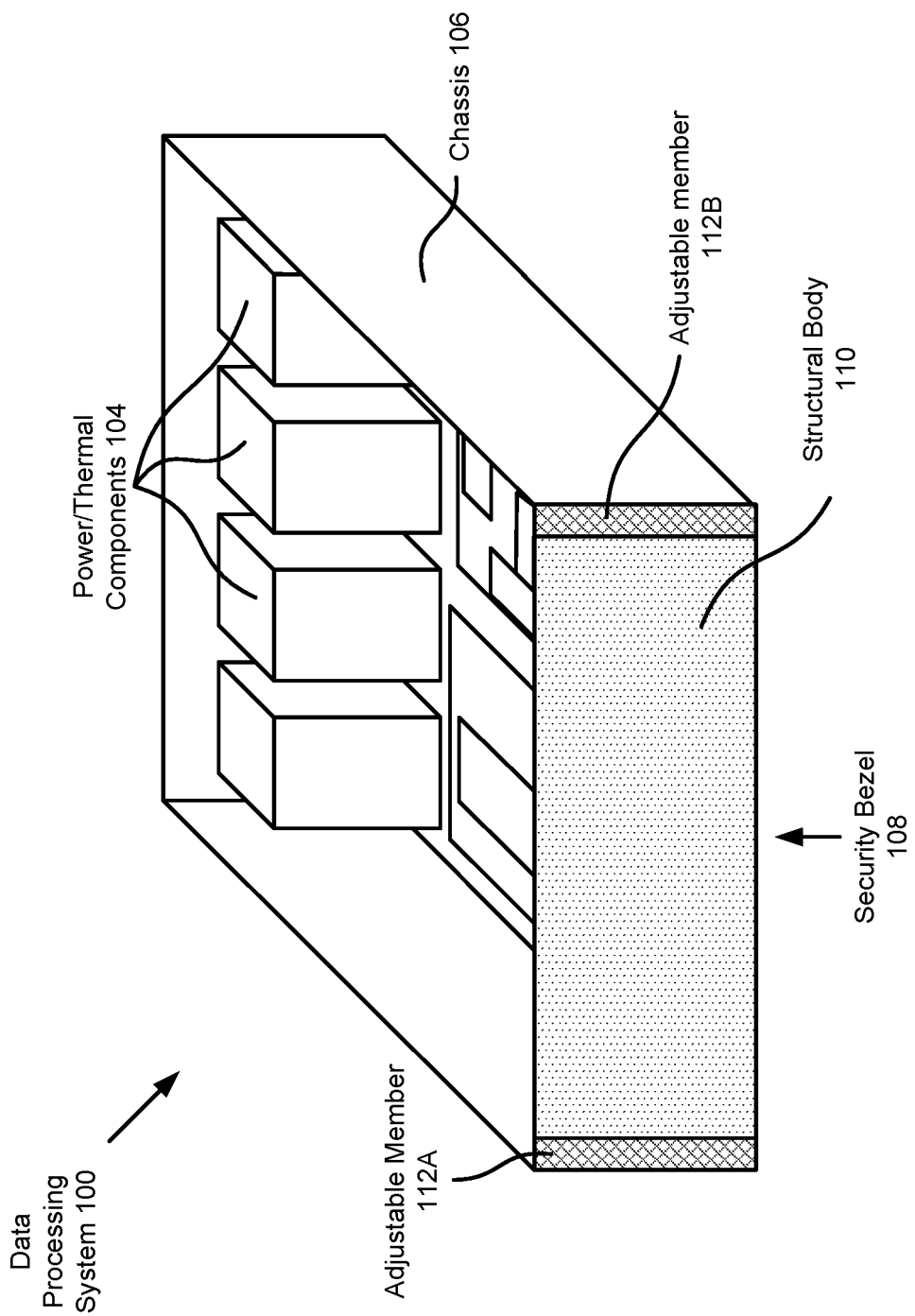

Turning to FIG. 1B, a diagram illustrating data processing system 100 in accordance with an embodiment is shown. As previously discussed, data processing system 100 may provide computer implemented services. To do so, data processing system 100 may include various hardware components that provide various functionalities on which the computer implemented services depend. However, access to the hardware components, provided by an opening in chassis 106, may leave data processing system 100 vulnerable to compromise, thereby increasing a likelihood of compromise to the computer implemented services. To decrease the likelihood of compromise caused by the access, data processing system 100 may include security bezel 108, as shown in FIG. 1B.

Security bezel 108 may prevent access to the hardware components positioned within an interior of chassis 106. To do so, security bezel 108 may (i) be implemented with (e.g., include) structural body 110 adapted to resist deformation due to force applied to structural body 110, and (ii) be positioned on a two-dimensional surface that spans a distance across the opening of chassis 106, discussed previously.

To provide its functionality, security bezel 108 may need to cover substantially all of an opening in chassis 106. Further, to securely attach to chassis 106, mating members of security bezel 108 may need to be aligned with complementary mating members of chassis 106. Thus, the width (e.g., across the width of the page in FIG. 1B) of security bezel 108 may need to be matched or at least take into account the length of an opening in chassis 106.

However, structural body 110 may have a first length that is equal to or less than a second length of the opening. If less than the second length, the first length may prevent the security bezel from preventing (e.g., obstructing) the intrusion into the interior.

For example, if the first length is less than the second length, then the structural body's sides (e.g., a left side and a right side, from a viewpoint of FIG. 1B) may be unable to make physical contact with edges of chassis 106 (e.g., where the opening meets with the walls of the chassis, complementary mating members, and/or other features of chassis 106). Therefore, structural body 110 may be unable to physically connect (e.g., secured) to chassis 106, may not be complementary to other features of chassis 106, and/or may otherwise not be compatible with chassis 106.

Consequently, if structural body 110 doesn't span the entirety of the second length, is not compatible with chassis 106, and/or is not secured to chassis 106, then structural body 110 may be unable to secure the opening to prevent the intrusion.

To adjust a third length of security bezel 108 (e.g., the total length of security bezel 108), security bezel 108 may include at least one adjustable member (e.g., adjustable member 112A) that connects to at least one side of structural body 110. The adjustable member may (i) be interchangeable with other structural members (e.g., adjustable member 112B) of various lengths, and/or (ii) facilitate continuous adjustment of the third length over a predetermined range.

For example, various interchangeable adjustable members may have different lengths and may be interchanged with one another (e.g., swapped) to modify the third length to various lengths. Accordingly, the adjustable members may be interchanged to make security bezel 108 compatible with chassis 106 (e.g., by aligning mating members, ensuring the entire opening is covered by security bezel 108, etc.)

In another example, adjustable member 112A may have a fixed length, but may partially insert some of its length inside of structural body 110. The amount of the length of adjustable member 112A that may be inserted inside structural body 110 may be varied over a range (e.g., by sliding adjustable member 112A into or out of structural body 110.

Once the third length of security bezel 108 is at a desired length, adjustable member 112A may be reversibly and/or fixedly attached to structural body 110 thereby placing security bezel 108 into compatibility with chassis 106.

It will be appreciated that although described as including a single adjustable member, a security bezel may include two or more adjustable members that are simultaneously connected to the security bezel. For example, security bezel 108 may include (i) structural body 110, (ii) adjustable member 112A, and/or (iii) adjustable member 112B, as illustrated in FIG. 1B. For additional information regarding the adjustable member and the security bezel, refer to FIG. 2A.

By connecting the adjustable member to structural body 110, the third length of the security bezel may be modified to match the second length of the opening. For example, if adjustable members 112A-112B have different lengths, swapping adjustable member 112A for adjustable member 112B (e.g., to connect to structural body 110) may change the length of security bezel 108.

By modifying the third length to match the second length, security bezel 108 may be secured to chassis 106 and adequately cover the opening to prevent the intrusion, thereby limiting access to the hardware components within an interior of chassis 106 (e.g., within data processing system 100). Thus, the computer implemented services dependent on the hardware components may have a reduced likelihood of compromise.

While illustrated in FIG. 1B with a limited number of specific components, a system may include additional, fewer, and/or different components without departing from embodiments disclosed herein.

As noted above, a security bezel may be used to secure hardware components in a chassis. To do so, the security bezel may include a structural body and at least one adjustable member. FIGS. 2A-2E show diagrams illustrating examples of a security bezel in accordance with an embodiment.

Turning to FIG. 2A, a first diagram illustrating security bezels (e.g., 200A-200B) in accordance with an embodiment is shown. It will be appreciated that either of security bezels 200A-200B may be similar to the security bezel discussed with respect to FIG. 1B (e.g., 108) and may include (i) a structural body (e.g., 201A or 201B) and (ii) an adjustable member (e.g., 206A or 208, respectively). In FIG. 2A, the viewpoint may be from a front of security bezels 200A-200B (e.g., the front being how each security bezel would be viewed from outside of a chassis) rather than from a perspective view of a security bezel as shown in FIG. 1B.

It will be appreciated that security bezels 200A-200B are illustrated as having different sizes (e.g., dimensions) due to being examples of various sizes for enclosures commonly used, for example, for rack mount chassis management systems. For example, security bezel 200A may be usable in conjunction with a 1 rack unit (1U) size chassis, and security bezel 200B may be usable in conjunction with a 2 rack unit (2U) size chassis.

Additionally, it will be appreciated that although described with regard to a structural body being connected to an adjustable member to form a security bezel, each of the structural bodies in FIG. 2A are depicted as being unconnected to respective adjustable members to illustrate features of each of these portions of security bezels 200A-200B.

As discussed above, security bezels (e.g., 200A-200B) may facilitate security management for various hardware components of data processing systems (e.g., 100) by preventing access to the hardware components. To prevent access to the hardware components, security bezels 200A-200B may be implemented using rigid, self-supporting super structures (e.g., structural bodies 201A-201B). These super structures may each be adapted to cover an opening of a respective chassis (e.g., chassis 106, previously discussed) that provides access to the hardware components. By having one of structural bodies 201A-201B cover an access (e.g., an opening), the structural body may screen the access to an interior of the respective chassis (e.g., 106) while enabling airflow into and/or out the respective chassis.

To do so, the structural body may include structural members (e.g., 202) and holes (e.g., 203). Each of these is discussed below.

The structural members may be arranged to partially cover a surface (e.g., the two-dimensional surface that spans a distance across the opening of chassis 106) and form a self-supporting structure (e.g., structural body 201A and/or 201B).

Each structural member of the structural members may (i) span a distance between two points on the surface (e.g., each of these points being a node at which some of the branches of material, depicted in FIG. 2A, connect to one another on a respective structural body), and (ii) resist deformation due to force applied to any number of the structural members.

These structural members may bound the holes (e.g., 203) through which gases may traverse. More particularly, each hole of the holes may be at least partially bound by a portion of the structural members. These boundaries (facilitated by the structural members) may result in an arrangement of at least a portion of the holes into an at least partial honeycomb pattern.

It will be appreciated that although illustrated as having a partial honeycomb pattern (referred to as a "first pattern") in FIG. 2A, a security bezel (e.g., 200A-200B) may be fabricated to have a complete honeycomb pattern (e.g., a pattern that includes more than one partial honeycomb pattern). For example, either of security bezels 200A-200B may be fabricated to include the first pattern and a second pattern that is similar to the first pattern. The first pattern and the second pattern may be physically connected to one another, and the second pattern may be positioned above or below the first pattern (from the viewpoint of FIG. 2A). By fabricating the security bezel to include any number of partial honeycomb patterns positioned above or below the first pattern, the security bezel may be fabricated to have a complete honeycomb pattern.

While described with respect to a honeycomb pattern, it will be appreciated that the holes may take on other patterns without departing from embodiments disclosed herein.

To further screen the access, the holes may have shapes and sizes that prevent general physical access to the interior of the respective chassis. Thus, entities and/or forces may be inhibited from interacting with the hardware components from an exterior of the respective chassis. However, the holes may facilitate movement of objects (e.g., specialized tools) below a size threshold through the surface while preventing components within the respective chassis from being removed through the holes.

For example, these holes may facilitate the insertion of a key into a lock residing in a lock space (e.g., 205A-205B). By inserting the key into the lock to manipulate the lock, the lock may further manipulate a latch mechanism (e.g., in latching portions 204A-204B). Thus, the latch mechanism may be manipulated in a particular manner (assuming a correct key is used to provide authority for the access) to facilitate access to the hardware components.

Although described with respect to a lock, it will be appreciated that a security bezel may include a latch mechanism but may not include a lock (e.g., on which manipulation of the latch mechanism depends).

As noted above, a latch mechanism may be manipulated in a particular manner to facilitate access to the hardware components. This latch mechanism may be implemented, at least in part, by at least one adjustable member (e.g., 206A and/or 208). For example, an adjustable member may be included in either of latching portions 204A-204B and may be adapted to reversibly secure a structural body of a security bezel to a respective chassis.

However, as previously discussed with regard to FIG. 1B, the structural body may have a first length that is equal to or less than a second length of an opening of the respective chassis (e.g., the opening of chassis 106). Consequently, if the structural body is unable to span the entirety of the second length (and therefore, not be adequately secured to the chassis), the structural body may be unable to adequately cover the opening to prevent the intrusion.

To match a third length (e.g., the third length discussed in FIG. 1B) of the security bezel to the second length, an adjustable member may be adapted to adjust the third length. For example, adjustable member 206A may be used to adjust a length of security bezel 200A to match a length of the opening of chassis 106, thereby causing security bezel 200A to adequately cover the opening to prevent the intrusion.

For additional information regarding adjustable members (e.g., 206A and/or 208), refer to FIGS. 2B-2E.

While illustrated in FIG. 2A with a limited number of specific components, a security bezel may include additional, fewer, and/or different components without departing from embodiments disclosed herein.

Figure 2B:
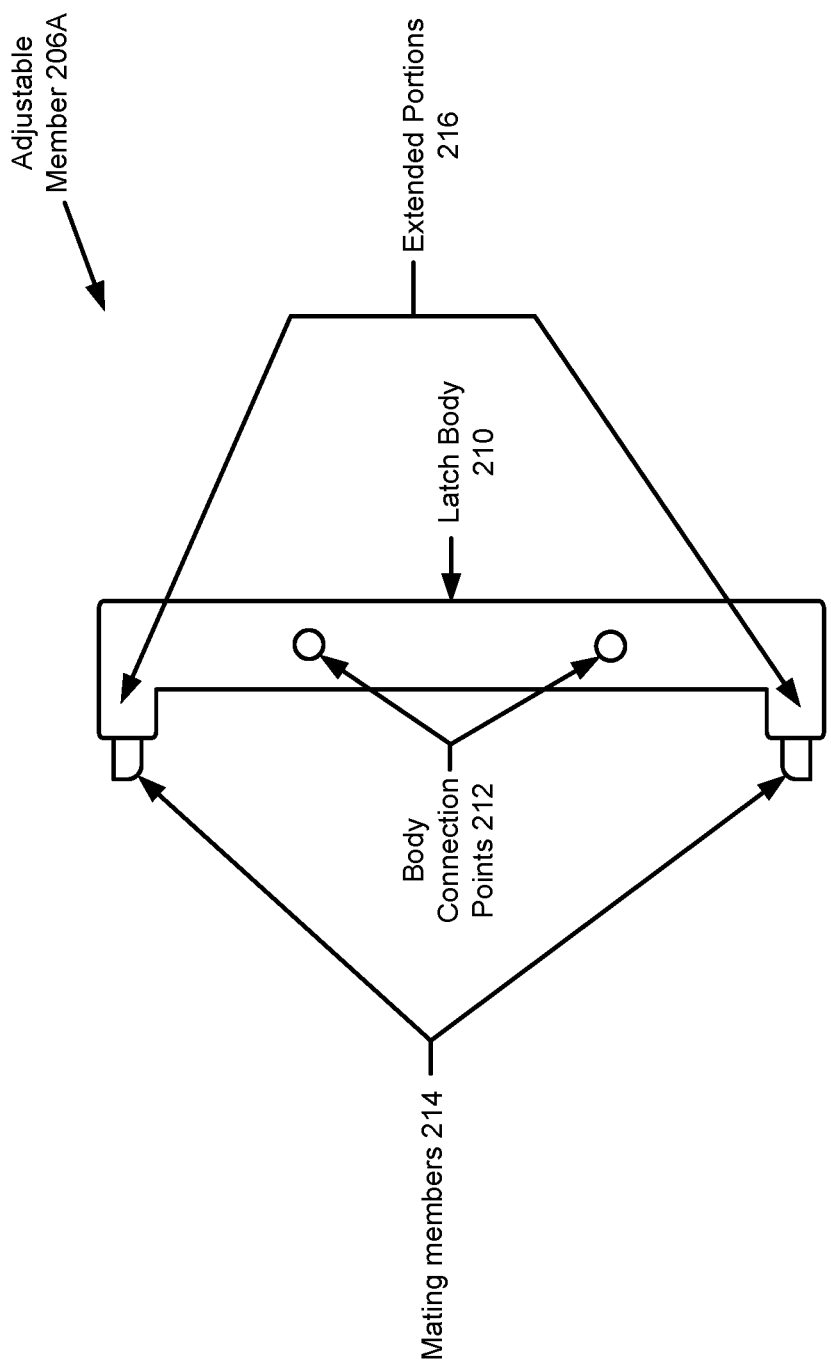
FIGS. 2B-2G show diagrams illustrating an adjustable member in accordance with an embodiment.

As noted above, a security bezel may have a length equal to or less than a length of an opening in a chassis. If less than the length of the opening, an adjustable member may be used to adjust the length of the security bezel to match the length of the opening. FIG. 2B shows a diagram illustrating an example of an adjustable member in accordance with an embodiment.

Turning to FIG. 2B, a diagram illustrating an adjustable member (e.g., 206A) in accordance with an embodiment is shown. In FIG. 2B, the viewpoint may be a magnification of adjustable member 206A, as shown in FIG. 2A.

As previously discussed, an opening in a chassis may provide access to an interior of the chassis, the chassis housing various hardware components on which computer implemented services depend. To limit access to the hardware components through the opening, thereby decreasing a likelihood of compromise of the hardware components, a security bezel may be positioned to cover the opening. To cover the opening, the security bezel may include (i) a structural body (previously discussed), and (ii) an adjustable member (e.g., 206A), discussed below.

Adjustable member 206A may connect to a side of the structural body to adjust a third length (the third length discussed with regard to FIGS. 1B-2A) of, for example, security bezel 200A in FIG. 2A. To do so, adjustable member 206A may, be connected to the side, thereby extending away from the structural body, and thus extending the third length. Additionally, in an embodiment, adjustable member 206A may facilitate a first connection between the structural body and the chassis.

To provide its functionality, adjustable member 206A may include latch body 210, body connection points 212, integration members 214, and extended portions 216, each of which is discussed below.

Latch body 210 may be implemented using a rigid structure adapted to impart (i) physical strength to adjustable member 206A and (ii) stability to a second connection between adjustable member 206A and the structural body. To do so, this rigid structure may (i) make physical contact with the structural body when adjustable member 206A is connected to the structural body and (ii) resist deformation from force applied to the security bezel.

To connect structural member 206A to the structural body, latch body 210 may include body connection points 212. Body connection points 212 may be points at which the second connection between the structural body and latch body 210 (and therefore, adjustable member 206A) is facilitated to secure latch body 210 to the structural body.

For example, one of body connection points 212 may be implemented with a bolt hole. The bolt hole may be aligned with a portion of the structural body (e.g., aligned with a similar hole to the bolt hole that is part of the structural body). A bolt may be inserted through the bolt hole until contact is made with the structural body (e.g., the bolt may be partially passed through the bolt hole and at least partially inserted into the similar hole). By inserting the bolt through the bolt hole and the portion of the structural body to make the second connection, adjustable member 206A may be secured to the structural body.

Although illustrated to include two points, it will be appreciated that body connection points 212 may include any number of points at which the second connection is facilitated.

To connect structural member 206A to the chassis, adjustable member 206A may include mating members 214. Mating members 214 may have a shape adapted to facilitate the first connection, thereby securing the structural body to the chassis.

For example, one of mating members 214 may be implemented with an appendage shaped like a hook, and this hook may correspond with structures on the chassis. For example, one of these structures may be a recess in the chassis wall (e.g., on a side of the opening). To make the first connection, the hook may be manipulated in a first manner to interact with the structure (e.g., the hook may be moved at least partially through the recess. Based on this first manner, the hook may maintain a particular position until manipulated in a second manner (e.g., using a latch mechanism and/or physically unhooked by an individual). Thus, mating members 214 and the maintained particular position may facilitate the first connection.

To adjust the third length, adjustable member 206A may include extended portions 216. Extended portions 216 may be protrusions of latch body 210 and may protrude from latch body 210 by a distance. This distance may vary between extended portions 216 and other extended portions of other various adjustable members (e.g., 208).

For example, and as previously discussed with regard to FIG. 1B, an adjustment member (e.g., 206A) may (i) be interchangeable with other structural members (e.g., 112B in FIG. 1B and/or 208 in FIG. 2A) of various lengths, and/or (ii) be continuously adjustable with regard to its length (e.g., the length of the adjustable member may be adjustable, discussed further below with regard to FIG. 2E). The various lengths may be due to various distances that the other extended portions protrude by. By having various extended portions of respective latch bodies protrude by different distances, a third length may be better matched to a second length (the second length, previously discussed) of the opening using adjustable member 206A and/or at least one of the other various adjustable members.

Figure 2C:
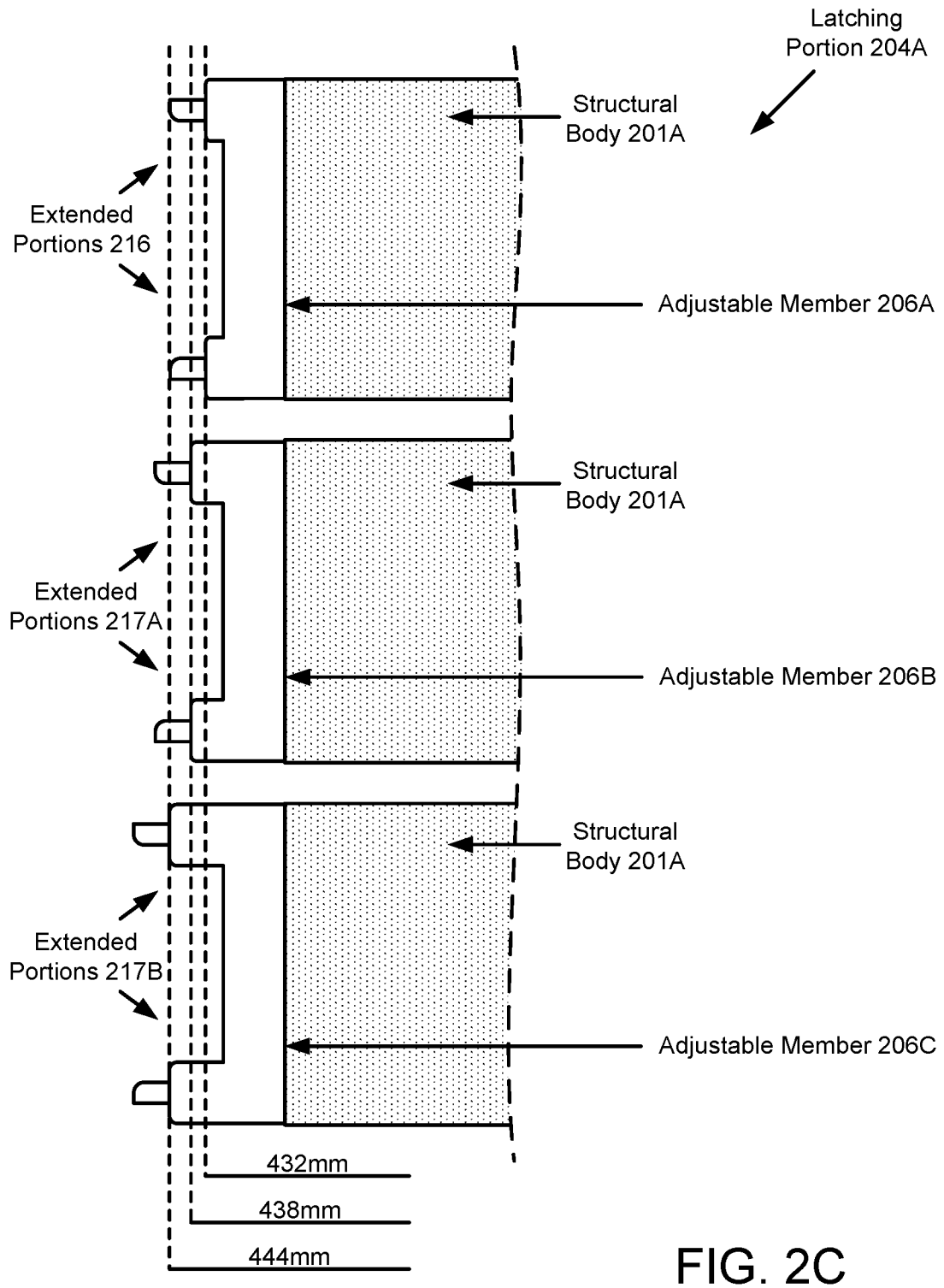
Figure 2D:
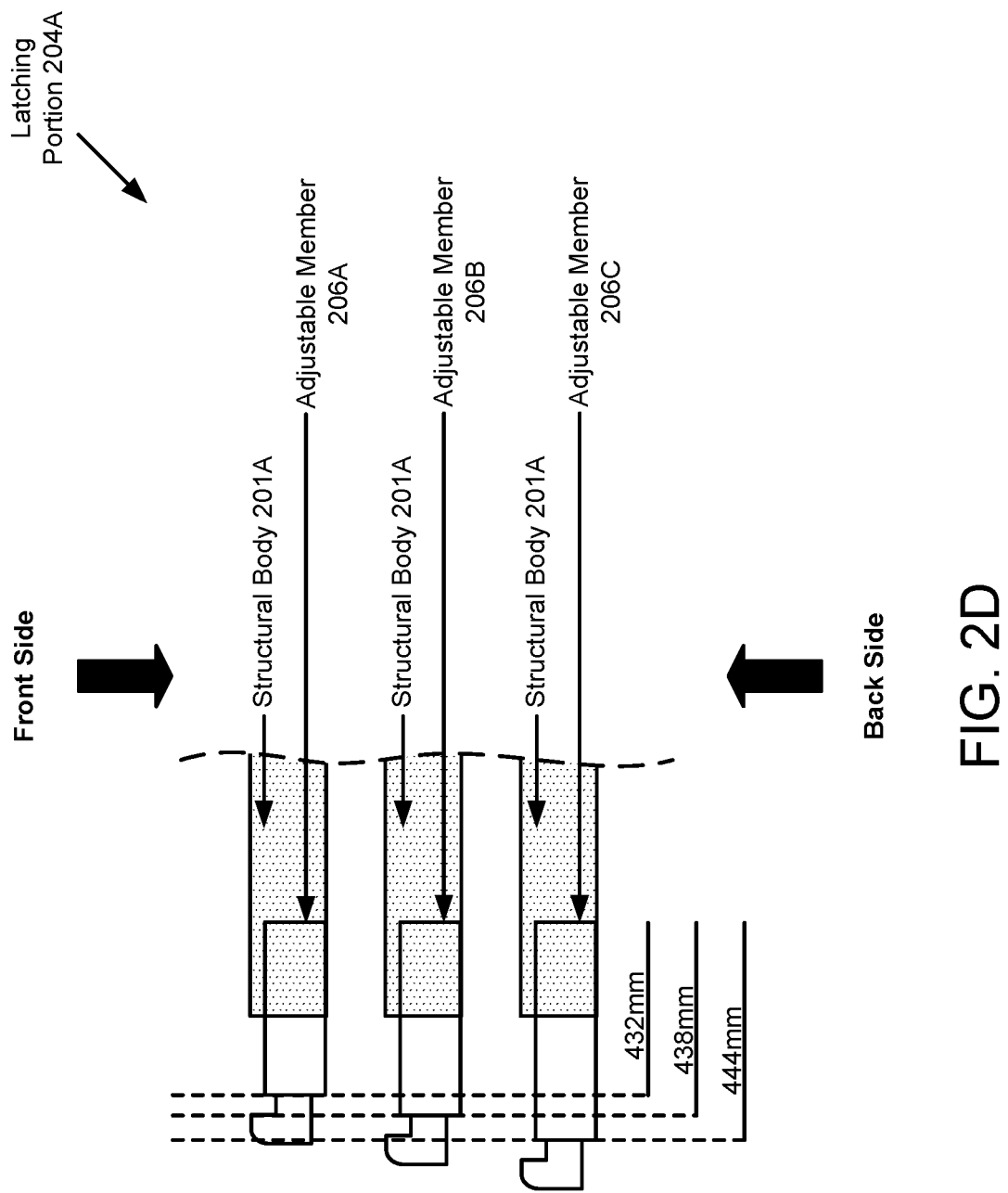

For additional information regarding the interchangeable members, refer to FIGS. 2C-2D.

While illustrated in FIG. 2B with a limited number of specific components, an adjustment member may include additional, fewer, and/or different components without departing from embodiments disclosed herein.

As noted above, an adjustable member may be interchangeable with other adjustable members. FIGS. 2C-2D show diagrams illustrating an example of a group of interchangeable adjustable members (e.g., adjustable member 206A and the at least one of the other various adjustable members) in accordance with an embodiment.

Turning to FIG. 2C, a first diagram illustrating a group of adjustable members (e.g., 206A-206C) in accordance with an embodiment is shown. In FIG. 2C, the viewpoint may be a magnification of latching portion 204A, shown in FIG. 2A.

As previously discussed, an adjustable member may be interchangeable with other adjustable members to adjust a third length (e.g., the third length discussed in FIG. 1B) of a security bezel (e.g., 108, 200A, and/or 200B). To do so, the adjustable members may have extended portions (e.g., 216 and 217A-217B) protruding from their respective latch bodies. The distances at which the extended portions protrude may vary between the adjustable members, as illustrated in FIG. 2C. Thus, the length of the adjustable members of the group may be different so that interchanging the adjustable members may change the third lengths to different lengths. For example, the third lengths may be adjusted to different lengths (e.g., 432 mm, 438 mm, 444 mm) based on which adjustable member is connected to structural body 201. In FIG. 2C, these different lengths are marked using dashed lines that run vertically on the page.

For example, adjustable member 206A may be interchangeable with adjustable members 206B-206C to change the third length from 432 mm to 438 mm or 444 mm, respectively. Each of these adjustable members being illustrated as connected to a left side of structural body 201A in FIG. 2C.

As shown in FIG. 2C, extended portions of adjustable member 206A (e.g., 216 in FIG. 2B) may extend a first distance of 432 mm (millimeters) from the structural body when connected to the structural body. Additionally, extended portions of structural members 206B-206C may extend a second distance of 438 mm and a third distance of 444 mm, respectively, from the structural body when connected (respectively) to the structural body. Therefore, by interchanging adjustable member 206A for either of adjustable members 206B-206C, the varying extended portions may cause the third length to change to place the security bezel into compatibility with different chassis. It will be appreciated that while described with respect to example discrete third lengths, the adjustable members may facilitate adjustment of the third lengths to any number of other lengths without departing from embodiments disclosed herein.

Turning to FIG. 2D, a second diagram illustrating the group of adjustable members (e.g., 206A-206C) in accordance with an embodiment is shown. In FIG. 2D, the viewpoint may be from a bottom of latching portion 204A, rather than from a front of latching portion 204A as shown in FIG. 2C. For example, a bottom side of latching portion 204A (and therefore, a bottom side of security bezel 200A) is illustrated as facing out of the page in FIG. 2D.

Additionally, in FIG. 2D, a front side of latching portion 204A and a back side of latching portion 204A are indicated in FIG. 2D using oversized black arrows. As shown in FIG. 2D, the front side is facing a top of the page rather than out of the page (as shown in FIG. 2C), and the back side (facing an interior of the chassis, and therefore away from a viewer outside of the chassis) is illustrated as facing a bottom of the page.

As previously discussed with regard to FIG. 2B, any of these adjustable members (e.g., 206A-206C) may include a latch body which may be implemented using a rigid structure that may (i) make physical contact with the structural body when the rigid structure is connected to the structural body and (ii) resist deformation from force applied to the security bezel.

For example, structural body 201A may have a shape adapted to receive any of the adjustable members, the adjustable members being positioned with a back side of structural body 201A when connected. By doing so, the connection (a second connection discussed with regard to FIG. 2B) between an adjustable member and a structural body may not be viewable from a front side of the security bezel (e.g., from outside the chassis). Therefore, a likelihood of manipulation of the connection may be reduced and/or prevented entirely.

While illustrated and described in FIGS. 2C-2D with respect to having specific distances of protrusion (e.g., thereby resulting in different third distances of 432 mm, 438 mm, and/or 444 mm when connected to structural body 201A), it will be appreciated that an extended portion of the extended portions may protrude by additional distances (e.g., a fourth, fifth, and/or sixth distance) without departing from embodiments disclosed herein.

Additionally, while illustrated in FIGS. 2C-2D with a limited number of specific components, a latching portion (e.g., 204A) may include additional, fewer, and/or different components without departing from embodiments disclosed herein.

As previously mentioned, an adjustment member may be used in manner that allows for continuous adjustment of the third length over a continuous range. FIGS. 2E-2G show diagrams illustrating an example of a continuously adjustable member (e.g., 303) in accordance with an embodiment. In FIGS. 2E-2G, a portion of a security bezel is shown in various phases of adjustment of the third length between two different lengths.

Figure 2E:
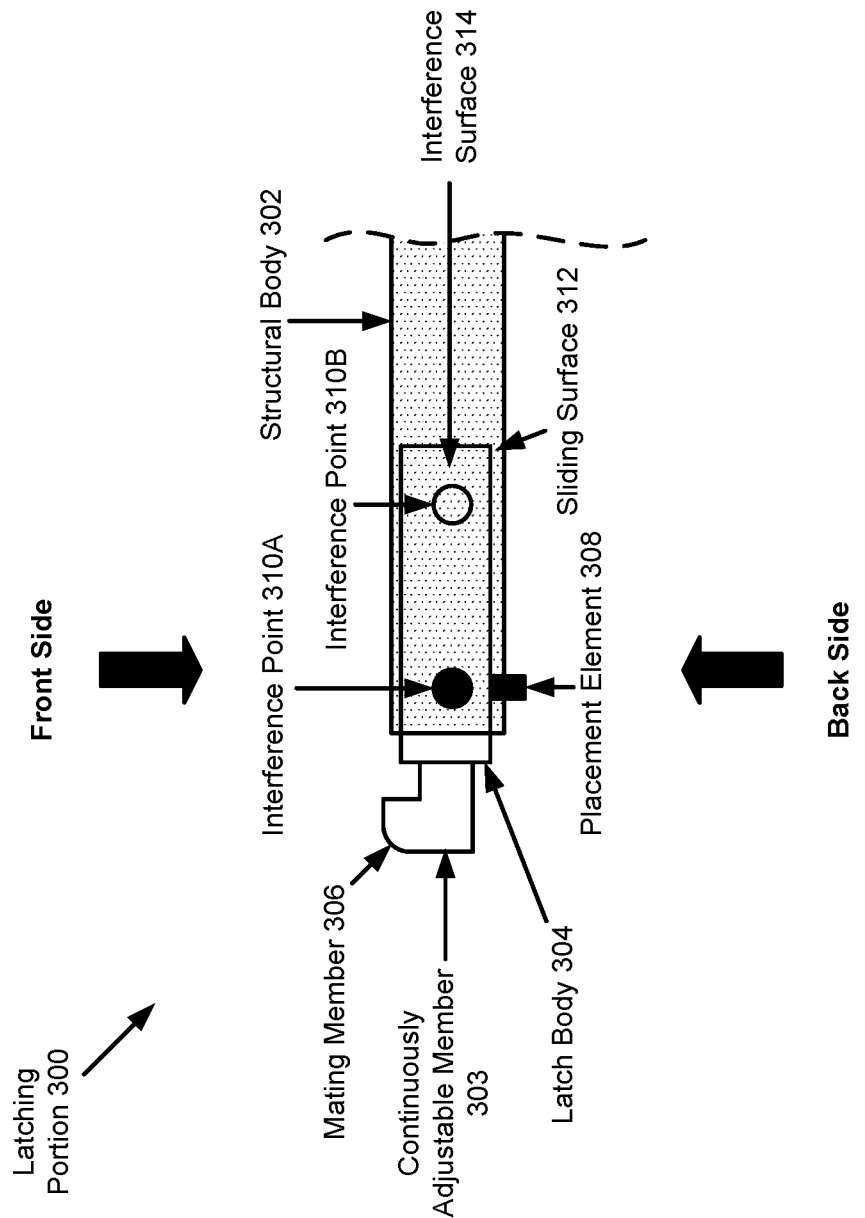
Figure 2F:
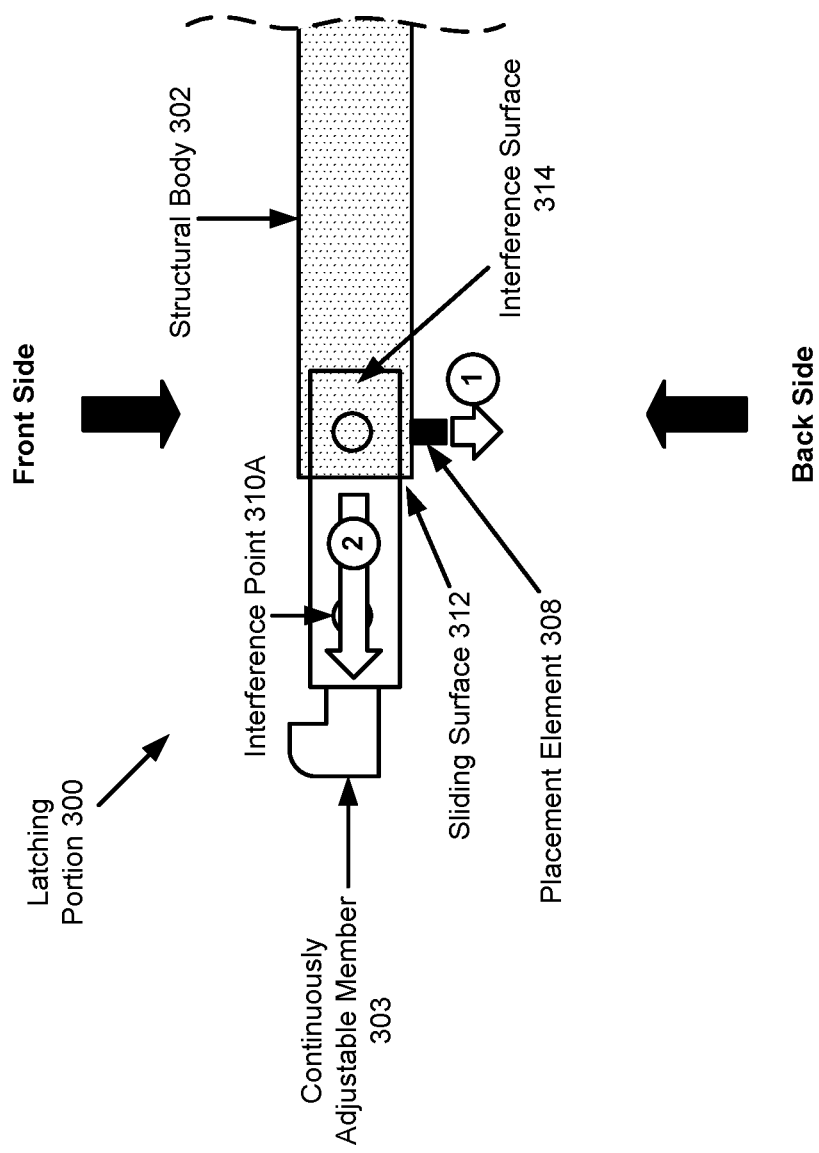
Figure 2G:
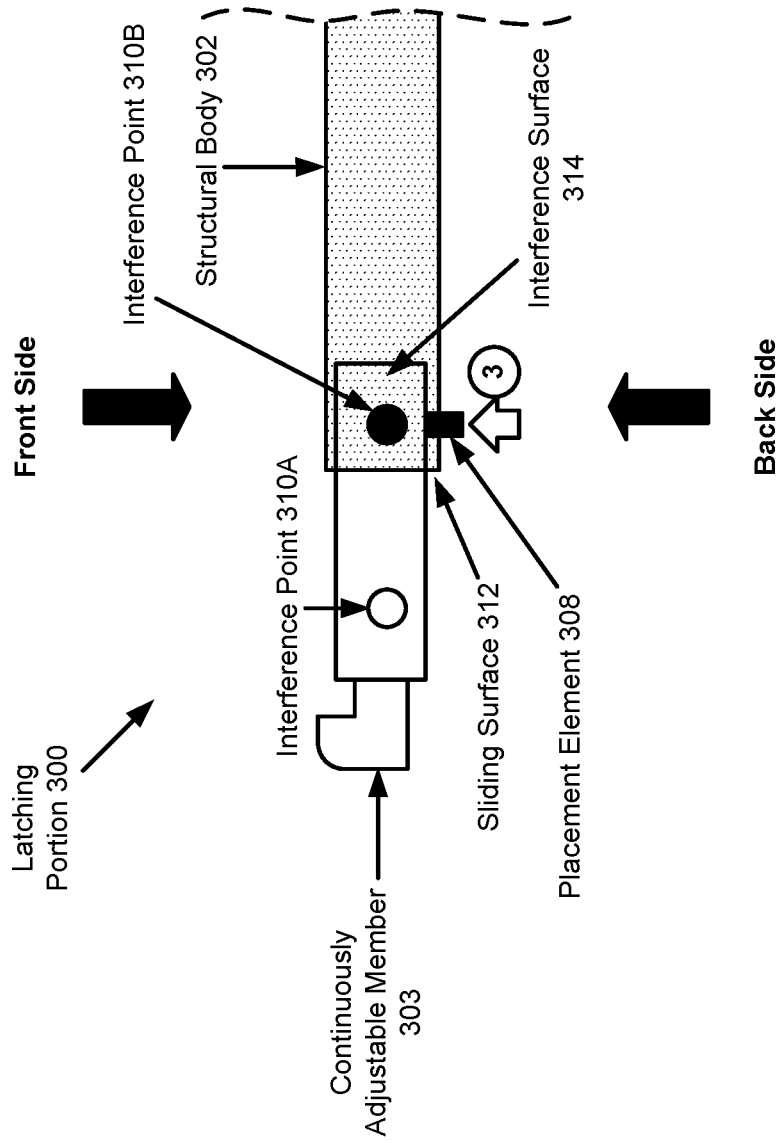

Turning to FIG. 2E, a first diagram illustrating an adjustment of a latching portion (e.g., 300) in accordance with an embodiment is shown. For example, this first diagram may illustrate a first phase of the adjustment. For additional information regarding a second and/or a third phase of the adjustment, refer to FIGS. 2F-2G.

In FIG. 2E, the viewpoint may be a bottom view of the latching portion similar to the viewpoint in FIG. 2D. For example, a bottom side of latching portion 300 (and therefore, a bottom side of a continuously adjustable member) is illustrated as facing out of the page. Additionally, similar to FIG. 2D, a front side and a back side of the latching portion is indicated using oversized black arrows.

As previously discussed, an adjustment member (e.g., 206A) may be interchangeable with other structural members (e.g., 206B-206C) of various lengths to adjust a third length of a security bezel (e.g., 200A). Additionally, in an embodiment, an adjustable member may be continuously adjustable allowing for continuous adjustment of the third length over a range of lengths without, for example, being interchanged for another adjustable member.

In FIG. 2E, latching portion 300 may include structural body 302 and continuously adjustable member 303, each of which is discussed below.

Continuously adjustable member 303 may have a similar functionality as the interchangeable adjustable members. For example, continuously adjustable member 303 may be adapted to reversibly secure a structural body (e.g., 302) to a chassis (e.g., 106).

To do so, continuously adjustable member 303 may include some similar components as the interchangeable adjustable members. For example, continuously adjustable member 303 may include a respective (i) latch body (e.g., 304), (ii) mating members (e.g., 306), and/or (iii) body connection points (e.g., interference points 310A-310B).

However, to be continuously adjustable, continuously adjustable member 303 may further include (i) sliding surface 312 and/or (ii) interference surface 314, each of which is discussed further below.

In an embodiment, structural body 302 may have a similar functionality as structural bodies 201A-201B. For example, structural body 302 may be adapted to (i) resist deformation due to force applied to structural body 302, and (ii) be positioned on a two-dimensional surface that spans a distance across an opening of the chassis (e.g., 106), discussed previously.

To do so, structural body 302 may include various components similar to structural bodies 201A-201B. For example, structural body 302 may include respective (i) structural members, (ii) holes, and/or (iii) lock spaces.

However, to facilitate a connection with continuously adjustable member 303, structural body 302 may further include (i) a hollow interior portion to facilitate partial insertion of latch body 304 and/or (ii) placement element 308 to facilitate reversible fixing of latch body 304 with respect to structural body 302, each of these is discussed below.

The hollow interior portion may house an adjustable amount of continuously adjustable member 303 (e.g., as shown in FIG. 2E). For example, a percentage of continuously adjustable member 303 housed within the hollow interior may change (e.g., by insertion/removal of some of latch body 304 from the hollow interior portion).

To do so, continuously adjustable member 303 may include sliding surface 312, adapted to allow movement of continuously adjustable member 303 along a fixed axis relative to structural body 302. For example, the fixed axis may be a straight line through structural body 302 from left to right (and/or right to left) on the page in FIG. 2E. Therefore, continuously adjustable member 303 may move into and/or out of the hollow interior along the fixed axis (e.g., while not fixedly positioned with respect to structural body 302).

Placement element 308 may reversibly fixedly position latch body 304 with respect to structural body 302. For example, placement element 308 may be implemented using a set screw to reversibly secure continuously adjustable member 303 to structural body 302. Therefore, a first position of placement element 308 (relative to structural body 302) may keep continuously adjustable member 303 at a first fixed position relative to structural body 302. To do so, continuously adjustable member 303 may include interference points 310A-310B along interference surface 314, adapted to provide adequate resistance to prevent movement along the fixed axis when placement element 308 is in the first position (e.g., screwed down such that friction between placement element 308 and interference with sliding surface 312 prevents movement of latch body 304).

For example, assume continuously adjustable member 303 requires an adjustment. During a first phase of the adjustment (depicted using FIG. 2E), placement element 308 may be in a first position. The first position may include placement element 308 extending through a wall of the hollow interior and exerting a force against latch body 304 at interference point 310A (illustrated using a black filled circle on latch body 304).

Although illustrated as having particular positions relative to latching portion 300, it will be appreciated that placement element 308 may have different positions without departing from embodiments herein.

The exerted force may secure continuously adjustable member 303 to structural body 302 in this position, thereby placing continuously adjustable member 303 at a first fixed (at least temporarily fixed based on the positioning of placement element 308) distance away from structural body 302. Consequently, the third length may be set at a first length.

Turning to FIG. 2F, a second diagram illustrating the adjustment of the latching portion (e.g., 300) in accordance with an embodiment is shown. For example, this second diagram may illustrate a second phase of the adjustment (second to the first phase discussed with regard to FIG. 2E). For additional information regarding a third phase of the adjustment, refer to FIG. 2G.

During the second phase of the adjustment (depicted using FIG. 2F), a first movement and a second movement may be performed with latching portion 300. The first movement (indicated by a circled number 1) may include moving placement element 308 to a second position away from latch body 302. In FIG. 2F, this manipulation of placement element 308 is depicted by (i) a transition of the previously black filled circle of interference point 310A (as shown in FIG. 2E) to a white circle, and (ii) a first white arrow pointing away from latch body 302 (toward a bottom of the page). Therefore, while in the second position, latch body 302 may be unrestrained by placement element 308, and continuously adjustable member 303 may be moved a second (not fixed) distance away from structural body 302. In doing so, a second movement may be allowed.

The second movement (indicated by a circled number 2) may include sliding continuously adjustable member 303 to the left of the page (e.g., latch body out of the hollow portion of structural body 302), thereby extending continuously adjustable member 303 away from structural body 302 which increases a magnitude of the third length. In FIG. 2F, this manipulation of continuously adjustable member 303 is depicted by a second white arrow pointing away and to the left of structural body 302.

In doing so, continuously adjustable member 303 may extend a third (not fixed) distance away from structural body 302.

Turning to FIG. 2G, a third diagram illustrating the adjustment of the latching portion (e.g., 300) in accordance with an embodiment is shown. For example, this third diagram may illustrate a third phase of the adjustment (e.g., after the second phase discussed with regard to FIG. 2F).

During the third phase of the adjustment (depicted using FIG. 2G), a third movement may be facilitated within latching portion 300. The third movement (indicated by a circled number 3) may include moving placement element 308 back to the first position (relative to structural body 302) where the force may be exerted against latch body 304.

However, due to the second movement changing a distance at which continuously adjustable member 303 extends, the force may be exerted at interference point 310B rather than interference point 310A. In FIG. 2G, this manipulation of placement element 308 is depicted by (i) a transition of the previously white circle of interference point 310B (as shown in FIG. 2E) to a black filled circle, and (ii) a first white arrow pointing toward latch body 302 (toward a top of the page).

Thus, the exerted force may secure continuously adjustable member 303 to structural body 302, continuously adjustable member 303 extending a second fixed (at least temporarily fixed based on the positioning of placement element 308) distance away from structural body 302.

Thus, these movements within latching portion 300 (depicted using FIGS. 2E-2G) may facilitate the adjustment of the third length.

While illustrated in FIGS. 2E-2G with a limited number of specific components, a latching portion (e.g., 300) may include additional, fewer, and/or different components without departing from embodiments disclosed herein.

Figure 3:
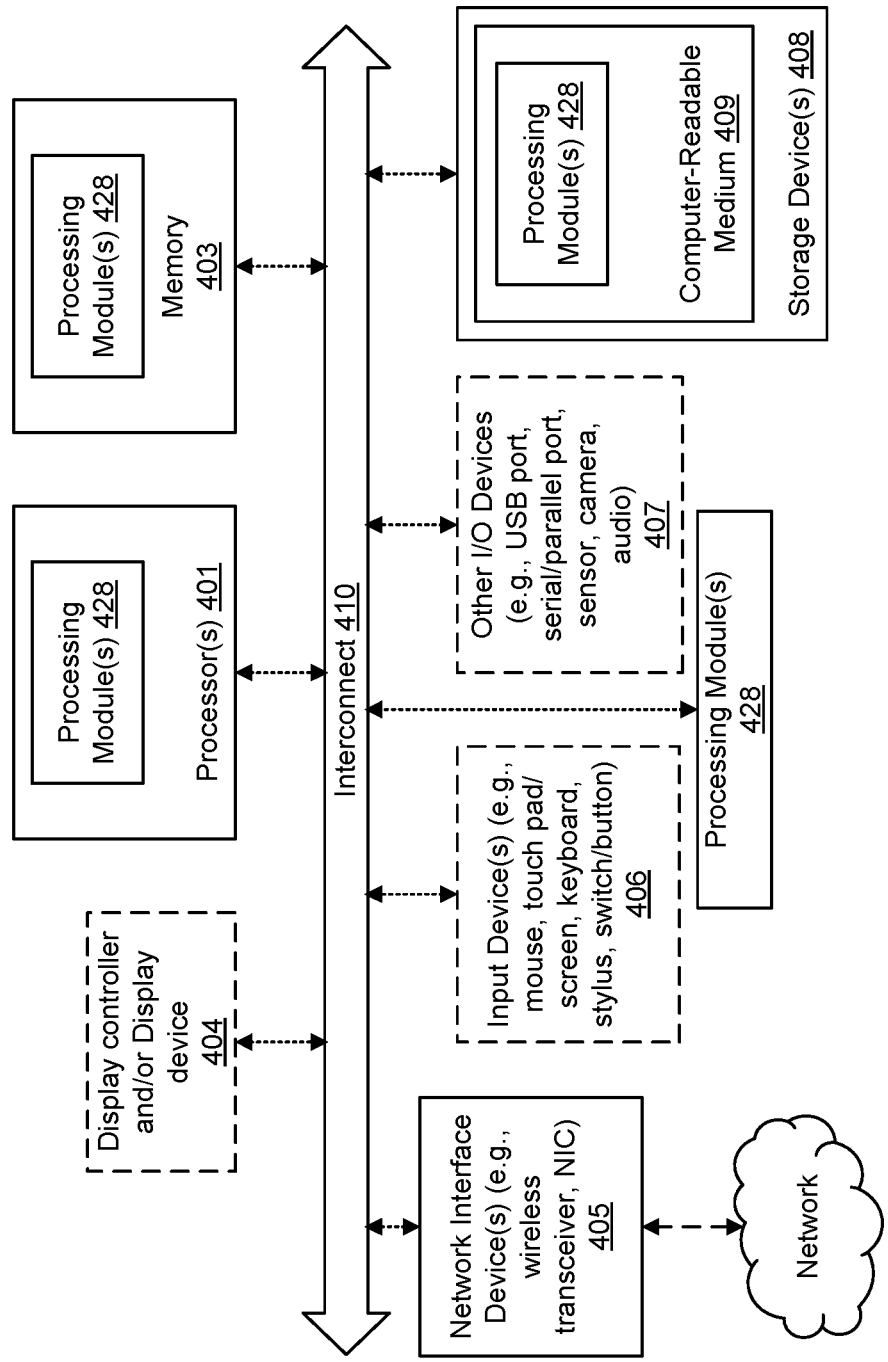
FIG. 3 shows a block diagram illustrating a data processing system in accordance with an embodiment.

Any of the components illustrated in FIGS. 1A-2E may be implemented with and/or used in conjunction with one or more computing devices. For example, the security bezel may be used to secure a chassis in which components of a data processing system may be positioned (e.g., processors, memory, etc.). Turning to FIG. 3, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high-level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a coprocessor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random-access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/ logic 428 can be implemented in any combination hardware devices and software components.

Note that while system 400 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A security bezel for a chassis of a data processing system, the security bezel comprising:
a structural body that:
has a first length that is equal to or less than a second length of a two-dimensional surface on the chassis,
prevents intrusion into an interior of the chassis through the surface,
facilitates traversal of gases through the surface, and
resists deformation due to force applied to the security bezel, and an adjustable member adapted to:
adjust a third length of the security bezel to match the second length, and
reversibly secure the structural body to the chassis,
wherein the adjustable member is one selected from a group of adjustable members consisting of:
an adjustable member kit comprising:
at least two interchangeable members; and
a continuously adjustable member,
wherein the security bezel has:
a fourth length when the structural body is connected to a first interchangeable member of the at least two interchangeable members, and
a fifth length when the structural body is connected to a second interchangeable member of the at least two interchangeable members,
wherein the fourth length matches the second length, and the fifth length matches a sixth length of a second surface on a second chassis, the second length and the sixth length being different lengths.

2. The security bezel of claim 1, wherein the continuously adjustable member comprises:
an interference surface adapted to receive a placement element, the continuously adjustable member being held in place with respect to the structural body while the placement element is received by the interference surface; and
a sliding surface adapted to slide along the structural body while the placement element is not received by the interference surface to allow for continuous adjustment of the third length over a range.

3. The security bezel of claim 1, wherein the structural body comprises structural members that form a partial covering for the surface, the structural members comprising a structural member adapted to:
span a distance between two points on the surface, and
resist deformation due to force applied to the structural member.

4. The security bezel of claim 3, wherein the structural body further comprises holes through the structural body, the holes comprising a hole that:
is positioned over a portion of the surface while the security bezel is attached to the chassis, the portion being at least partially bounded by the structural member,
is adapted to allow traversal of gasses through the at least partially bounded portion, and
has a size adapted to prevent intrusion into an interior of the chassis through the at least partially bound portion.

5. The security bezel of claim 4, wherein the size is further adapted to facilitate movement of objects below a size threshold through the portion.

6. The security bezel of claim 5, wherein the hole further comprises a portion of a lock space in which a lock mechanism of the security bezel is positioned, the lock mechanism being adapted to reversibly lock the security bezel to the chassis.

7. The security bezel of claim 1, further comprising a second adjustable member, the adjustable member and the second adjustable member being adapted for reversible attachment to opposite sides of the structural body.

8. An enclosure comprising:
a chassis; and
a security bezel for the chassis, the security bezel comprising:
 a structural body that:
  has a first length that is equal to or less than a second length of a two-dimensional surface on the chassis,
  prevents intrusion into an interior of the chassis through the surface,
  facilitates traversal of gases through the surface, and
  resists deformation due to force applied to the security bezel, and
 an adjustable member adapted to:
  adjust a third length of the security bezel to match the second length, and
  reversibly secure the structural body to the chassis,
 wherein the adjustable member is one selected from a group of adjustable members consisting of:
  an adjustable member kit comprising:
  at least two interchangeable members; and
  a continuously adjustable member,
 wherein the security bezel has:
  a fourth length when the structural body is connected to a first interchangeable member of the at least two interchangeable members, and
  a fifth length when the structural body is connected to a second interchangeable member of the at least two interchangeable members,
  wherein the fourth length matches the second length, and the fifth length matches a sixth length of a second surface on a second chassis, the second length and the sixth length being different lengths.

9. The enclosure of claim 8, wherein the continuously adjustable member comprises:
 an interference surface adapted to receive a placement element, the continuously adjustable member being held in place with respect to the structural body while the placement element is received by the interference surface; and
 a sliding surface adapted to slide along the structural body while the placement element is not received by the interference surface to allow for continuous adjustment of the third length over a range.

10. The enclosure of claim 8, wherein the structural body comprises structural members that form a partial covering for the surface, the structural members comprising a structural member adapted to:
 span a distance between two points on the surface, and
 resist deformation due to force applied to the structural member.

11. The enclosure of claim 10, wherein the structural body further comprises holes through the structural body, the holes comprising a hole that:
 is positioned over a portion of the surface while the security bezel is attached to the chassis, the portion being at least partially bounded by the structural member,
 is adapted to allow traversal of gasses through the at least partially bounded portion, and
 has a size adapted to prevent intrusion into an interior of the chassis through the at least partially bound portion.

12. The enclosure of claim 11, wherein the size is further adapted to facilitate movement of objects below a size threshold through the portion.

13. The enclosure of claim 12, wherein the hole further comprises a portion of a lock space in which a lock mechanism of the security bezel is positioned, the lock mechanism being adapted to reversibly lock the security bezel to the chassis.

14. The enclosure of claim 8, further comprising a second adjustable member, the adjustable member and the second adjustable member being adapted for reversible attachment to opposite sides of the structural body.

15. A data processing system comprising:
a chassis;
hardware components positioned in the chassis; and
a security bezel for the chassis, the security bezel comprising:
 a structural body that:
  has a first length that is equal to or less than a second length of a two-dimensional surface on the chassis,
  prevents intrusion into an interior of the chassis through the surface,
  facilitates traversal of gases through the surface, and
  resists deformation due to force applied to the security bezel, and
 an adjustable member adapted to:
  adjust a third length of the security bezel to match the second length, and
  reversibly secure the structural body to the chassis,
 wherein the adjustable member is one selected from a group of adjustable members consisting of:
  an adjustable member kit comprising:
  at least two interchangeable members; and
  a continuously adjustable member,
 wherein the security bezel has:
  a fourth length when the structural body is connected to a first interchangeable member of the at least two interchangeable members, and
  a fifth length when the structural body is connected to a second interchangeable member of the at least two interchangeable members,
  wherein the fourth length matches the second length, and the fifth length matches a sixth length of a second surface on a second chassis, the second length and the sixth length being different lengths.

16. The data processing system of claim 15, wherein the continuously adjustable member comprises:
 an interference surface adapted to receive a placement element, the continuously adjustable member being held in place with respect to the structural body while the placement element is received by the interference surface; and
 a sliding surface adapted to slide along the structural body while the placement element is not received by the interference surface to allow for continuous adjustment of the third length over a range.

17. The data processing system of claim 15, wherein the structural body comprises structural members that form a partial covering for the surface, the structural members comprising a structural member adapted to:
 span a distance between two points on the surface, and
 resist deformation due to force applied to the structural member.

18. The data processing system of claim 17, wherein the structural body further comprises holes through the structural body, the holes comprising a hole that:
- is positioned over a portion of the surface while the security bezel is attached to the chassis, the portion being at least partially bounded by the structural member,
- is adapted to allow traversal of gasses through the at least partially bounded portion, and
- has a size adapted to prevent intrusion into an interior of the chassis through the at least partially bound portion.

19. The data processing system of claim 18, wherein the size is further adapted to facilitate movement of objects below a size threshold through the portion.

20. The data processing system of claim 19, wherein the hole further comprises a portion of a lock space in which a lock mechanism of the security bezel is positioned, the lock mechanism being adapted to reversibly lock the security bezel to the chassis.

* * * * *